(12) United States Patent
Haraguchi

(10) Patent No.: US 6,777,694 B2
(45) Date of Patent: Aug. 17, 2004

(54) ELECTRON BEAM EXPOSURE SYSTEM AND ELECTRON LENS

(75) Inventor: Takeshi Haraguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/422,279

(22) Filed: Apr. 23, 2003

(65) Prior Publication Data

US 2003/0183773 A1 Oct. 2, 2003

Related U.S. Application Data

(63) Continuation of application No. PCT/JP01/09931, filed on Nov. 14, 2001.

(30) Foreign Application Priority Data

Dec. 6, 2000 (JP) ........................................ 2000-371638

(51) Int. Cl.[7] ................................................. G21G 5/00
(52) U.S. Cl. ............................... 250/492.2; 250/396 R; 250/396 ML
(58) Field of Search ..................... 250/396 ML, 396 R, 250/492.22

(56) References Cited

U.S. PATENT DOCUMENTS

| 4,209,702 A | * | 6/1980 | Shirai et al. ......... 250/396 ML |
| 5,912,469 A | | 6/1999 | Okino |
| 5,981,954 A | * | 11/1999 | Muraki ....................... 250/397 |

FOREIGN PATENT DOCUMENTS

| JP | 54-23476 | 2/1979 |
| JP | 61-3098 | 1/1986 |
| JP | 10-079346 | 3/1998 |
| JP | 11-354063 | 12/1999 |

* cited by examiner

Primary Examiner—John R. Lee
Assistant Examiner—James J. Leybourne
(74) Attorney, Agent, or Firm—Morrison & Foerster LLP

(57) ABSTRACT

An electron beam exposure system for exposing a pattern on a wafer using a plurality of electron beams, comprising a section for generating a plurality of electron beams, an electron lens section having a plurality of apertures for passing a plurality of electron beams and focusing the plurality of electron beams independently, and a magnetic field formation section provided at least one of the plurality of apertures and forming a magnetic field in a direction substantially perpendicular to the irradiating direction of an electron beam passing through the aperture.

16 Claims, 6 Drawing Sheets

ELECTRON BEAM EXPOSURE SYSTEM AND ELECTRON LENS

The present application is a continuation application of PCT/JP01/09931 filed on Nov. 14, 2001, claiming priority from a Japanese patent application No. 2000-371638 filed on Dec. 6, 2000, the contents of which are incorporated here in by reference.

BACKGROUND OF THE INVENTION

1. Field of the Invention

The present invention relates to an electron beam exposure system and an electron lens.

2. Description of the Related Art

FIG. 1 is a cross sectional view showing a multi-axis electron lens 350 in a conventional electron beam exposure system. In the multi-axis electron lens 350, a plurality of electron beams 320 are focused independently using two magnetic conductors 330 which include a lens coil 310 and a plurality of apertures 320.

However, since a magnetic field 340 formed in the plurality of apertures 320 by one lens coil 310 does not become symmetrical to medial axes of the apertures 320, it is difficult to focus the plurality of electron beams, which pass through the apertures 320 respectively, on predetermined positions.

SUMMARY OF THE INVENTION

Accordingly, it is an object of the present invention to provide an electron beam exposure system and an electron lens which can solve the foregoing problem. The object can be achieved by combinations described in the independent claims. The dependent claims define further advantageous and exemplary combinations of the present invention.

In order to solve the foregoing problem, according to the first aspect of the present invention, there is provided an electron beam exposure system for exposing a pattern on a wafer by a plurality of electron beams, in which the system includes: an electron beam generating section for generating the plurality of electron beams; an electron lens section with a plurality of apertures through which the plurality of electron beams pass, for independently focusing the plurality of electron beams; and a first magnetic field formation section, which is provided in at least one of the plurality of apertures, for forming a magnetic field in a direction substantially perpendicular to an irradiation direction of the electron beams passing through one of the plurality of apertures.

In the electron beam exposure system the first magnetic field formation section may be provided on a wall of one of the plurality of apertures.

The first magnetic field formation section may include a coil for forming a magnetic field and an insulating member provided between the coil and the wall of the aperture.

The first magnetic field formation section may includes: a plurality of first magnetic field formation sections, which are provided in the plurality of apertures; and a coil control section for independently controlling current supplied to each of the plurality of first magnetic field formation sections.

The coil control section may independently control current supplied to each of the plurality of first magnetic field formation sections based on position of each of the plurality of apertures in which each of the plurality of first magnetic field formation sections is provided.

The coil control section may control the current so that current supplied to a part of the plurality of magnetic field formation sections provided in first apertures of the plurality of apertures is higher than current supplied to another part of the plurality of magnetic field formation sections provided in second apertures of the plurality of apertures, where the second apertures are located outside of the first apertures in the electron lens section.

The electron beam exposure system may further include a second magnetic field formation section provided in a position for forming magnetic field in a direction substantially perpendicular to the direction of the magnetic field formed in the aperture by the first magnetic field formation section.

The electron beam exposure system may further include a coil control section for independently controlling the current supplied to the first magnetic field formation section and current supplied to the second magnetic field formation section.

The electron beam exposure system may further include a third magnetic field formation section and a fourth magnetic field formation section, which are provided in an opposite side of the first magnetic field formation section and the second magnetic field formation section respectively.

In the electron beam exposure system according to the invention, the electron lens section may include: a first magnetic conductor with a plurality of apertures through which the plurality of electron beams pass; a second magnetic conductor with a plurality of apertures through which the plurality of electron beams pass; wherein the second magnetic conductor is provided substantially parallel with the first magnetic conductor; the first magnetic field formation section is provided in the apertures of the first magnetic conductor, and the electron beam exposure system further comprises a fifth magnetic field formation section provided in the apertures of the second magnetic conductor.

The electron beam exposure system may further include a cooling section for cooling the first magnetic conductor and the second magnetic conductor.

The electron beam exposure system may further include: a substrate, which is provided substantially in parallel with the electron lens section, including wiring in which the current to the first magnetic field formation section flows; and a wire section for connecting the first magnetic field formation section and the wiring.

According to another aspect of the invention, an electron lens for independently focusing a plurality of electron beams, includes: a first magnetic conductor with a plurality of apertures through which the plurality of electron beams pass; a second magnetic conductor with a plurality of apertures through which the plurality of electron beams pass, wherein the second magnetic conductor is provided substantially parallel with the first magnetic conductor; and a magnetic field formation section, which is provided in at least one aperture of the plurality of first apertures and the plurality of second apertures, for forming a magnetic field in a direction substantially perpendicular to an irradiation direction of the electron beams passing through the apertures.

According to a third aspect of the invention, an electron beam exposure system for exposing a pattern on a wafer by a plurality of electron beams, includes: an electron beam exposure apparatus; comprising: an electron beam generating section provided at one end of the electron beam exposure apparatus; a wafer stage provided at the other end of the electron beam exposure apparatus, and opposing to the electron beam generating section; at least one shaping member provided between the electron beam generating section and the wafer stage, including a plurality of apertures having predetermined shapes, each of the apertures having an axis extending in a direction substantially parallel with an irradiation direction of the electron beams; and at least one electron lens section provided between the electron beam generating section and the wafer stage, and positioned either upstream or downstream of the shaping member in the irradiation direction of the electron beams, the electron beam generating section includes: a plurality of apertures with an axis extending in a direction substantially parallel with the irradiation direction of the electron beams; and at least one magnetic field formation section provided at each of the plurality of apertures, the magnetic field formation section being symmetrical with respect to the axis of the aperture of the electron lens section.

According to a fourth aspect of the invention, an electron lens used for an electron beam exposure system for exposing a pattern on a wafer by a plurality of electron beams, includes: a plurality of apertures with an axis extending in a direction substantially parallel with the irradiation direction of the electron beams; and at least one magnetic field formation section provided at each of the plurality of apertures, the magnetic field formation section being symmetrical with respect to the axis of the aperture of the electron lens section.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
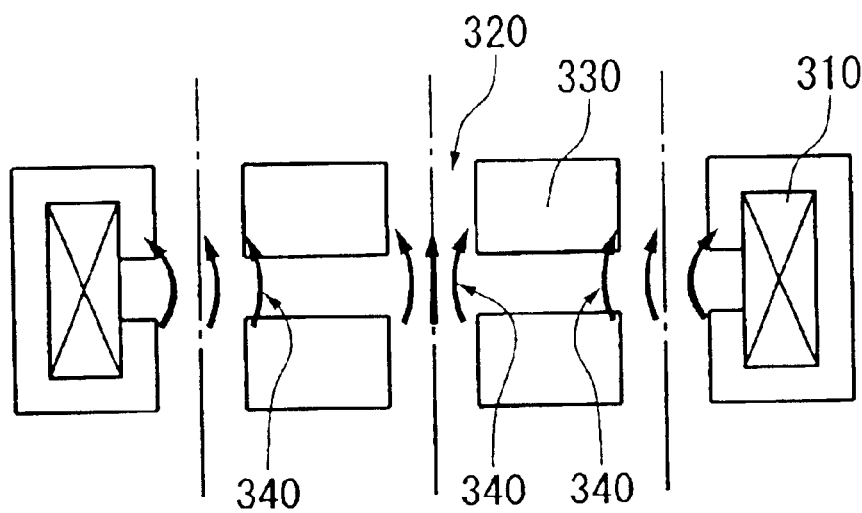
FIG. 1 is a cross section view showing a multi-axis electron lens in a conventional electron beam exposure system.
Figure 2:
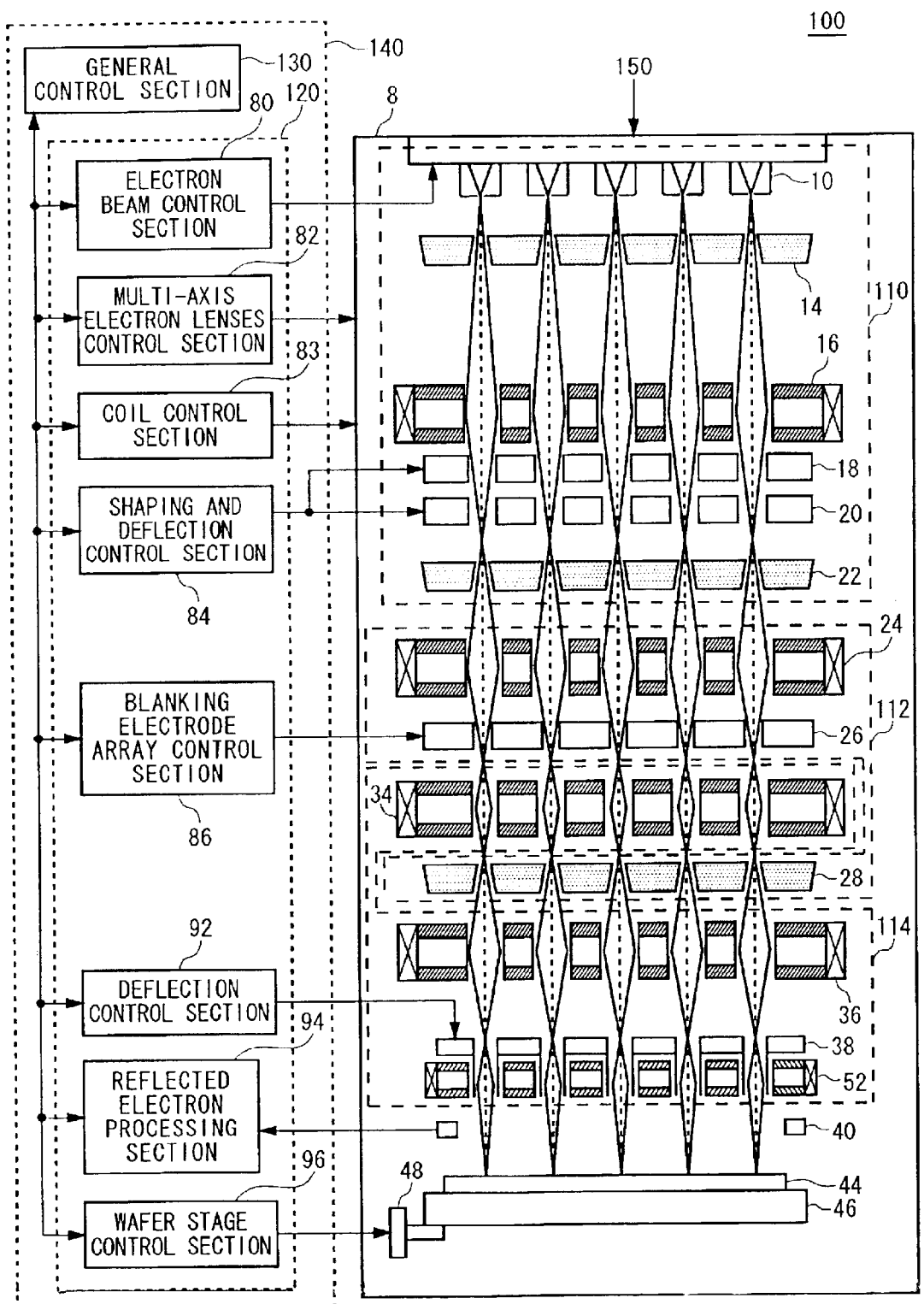
FIG. 2 shows a configuration of an electron beam exposure system according to an embodiment of the present invention.

FIG. 2 is a configuration of an electron beam exposure system 100 according to an embodiment of the present invention. The electron beam exposure system 100 includes an exposure section 150 for performing a predetermined exposure processing on a wafer using an electron beam, and a control system 140 for controlling operation of each composition of the exposure section 150.

The exposure section 150 generates a plurality of electron beams inside a case 8, and includes electron beam shaping means 110 for shaping a cross-sectional shape of the electron beams into desired shapes, irradiation selecting means 112 for selecting whether each of the electron beams is to be irradiated on a wafer 44 independently, and a wafer projection system 114 for adjusting direction and size of a pattern image which is irradiated on the wafer 44. Moreover, the exposure section 150 includes a wafer stage 46 on which the wafer 44 for exposing a pattern is mounted, and a wafer stage drive section 48 for driving the wafer stage 46. Furthermore, the exposure section 150 includes an electron detector 40 for detecting such as secondary electrons and reflected electrons emitted from a mark section due to the electron beam irradiated on the mark section, which is provided on the wafer 44 or the wafer stage 46. The electron detector 40 outputs a detected signal in accordance with the amount of detected electrons to a reflected electron processing section 94.

According to embodiments described hereinafter, a coil section is used as an example-of a magnetic field formation section. However, it should be understood that any kind of element which forms a magnetic field is applicable to the magnetic field formation section.

The electron beam shaping means 110 includes: an electron beam generating section 10 for generating a plurality of electron beams; a first shaping member 14 and a second shaping member 22 with a plurality of apertures for shaping cross-sectional shapes of the irradiated electron beams by letting the electron beams pass through the apertures; a first multi-axis lens 16 with a plurality of apertures through which the plurality of electron beams pass, focusing each of the plurality of electron beams independently, and adjusting the focal point of each of the plurality of electron beams; and a first shaping deflector 18 and a second shaping deflector 20 for independently deflecting the plurality of electron beams which have passed the first shaping member 14. Furthermore, the electron beam shaping means 110 includes a coil section, which is provided at a desired aperture of the first multi-axis electron lens 16, for forming a magnetic field in the direction substantially perpendicular to the irradiation direction of the electron beam which passes through the aperture.

The irradiation selecting means 112 includes: a second multi-axis electron lens 24 for focusing the plurality of electron beams independently, and adjusts the focal point of the plurality of electron beams; the blanking-electrode array 26 for independently selecting whether each of the electron beams is to be irradiated on the wafer 44 by selectively deflecting each of the plurality of electron beams; an electron beam blocking member 28 for blocking the electron beams deflected by the blanking-electrode array 26, where the electron beam blocking member 28 includes a plurality of apertures through which the electron beams pass. Furthermore, the irradiation selecting means 112 is provided at a desired aperture of the second multi-axis electron lens 16, and it includes a coil section which forms a magnetic field in the direction substantially perpendicular to the irradiation direction of the electron beam which passes through the aperture. In another example, the blanking-electrode array 26 is a blanking aperture array device.

The wafer projection system 114 includes: a third multi-axis electron lens 34 for independently focusing the plurality of electron beams, and reduces irradiation diameter of the electron beams; a fourth multi-axis electron lens 36 for independently focusing the plurality of electron beams, and adjusting focal points of the plurality of electron beams; a deflecting section 38 for independently deflecting each of the plurality of electron beams to desired positions on the wafer 44; and a fifth multi-axis electron lens 52 which functions as an objective lens to the wafer 44, and which independently focuses each of the plurality of electron beams. Furthermore, the wafer projection system 114 is provided at desired apertures of the third multi-axis electron lens 16, the fourth multi-axis electron lens, and the fifth multi-axis electron lens, and it includes a coil section which forms a magnetic field in the direction substantially perpendicular to the irradiation direction of the electron beam which passes through the aperture.

The control system 140 includes an individual control section 120 and a general control section 130. The individual control section 120 includes an electron beam control section 80, a multi-axis electron lenses control section 82, a coil control section 83, a shaping and deflection control section 84, a blanking electrode array control section 86, a deflection control section 92, a reflected electron processing section 94, and a wafer stage control section 96. The general control section 130 includes a position detector 132 for detecting an irradiation position of the electron beam based on a detected signal output from the electron detector 40. For example, the general control section 130 is a work station, and collectively controls each control section of the individual control section 120.

The electron beam control section 80 controls the electron beam generating section 10. The multi-axis electron lenses control section 82 controls the current supplied to the first multi-axis electron lens 16, the second multi-axis electron lens 24, the third multi-axis electron lens 34, the fourth multi-axis electron lens 36, and the fifth multi-axis electron lens 52. The coil control section 83 controls the current supplied to the coil sections provided in the apertures of the first multi-axis electron lens 16, the second multi-axis electron lens 24, the third multi-axis electron lens 34, the fourth multi-axis electron lens 36, and the fifth multi-axis electron lens 52. The shaping and deflection control section 84 controls the first shaping deflector 18 and the second shaping deflector 20. The blanking electrode array control section 86 controls voltage applied to deflecting electrodes of the blanking-electrode array 26. The deflection control section 92 controls voltage applied to deflecting electrodes of a plurality of deflectors of the deflecting section 38. The reflected electron processing section 94 sends a detected signal, which is output from the electron detector 40, in association with the electron detector 40 which outputs the detected signal, to the position detector 132 of the general control section 130. The wafer stage control section 96 controls the wafer stage drive section 48, and moves the wafer stage 46 to a predetermined position.

Operation of the electron beam exposure system 100 according to the present embodiment will be explained hereinafter. First, the electron beam generating section 10 generates a plurality of electron beams. The first shaping member 14 shapes the plurality of electron beams, which is generated by the electron beam generating section 10 and irradiated on the first shaping member 14, by letting the electron beams pass through a plurality of apertures provided in the first shaping member 14. In alternate example, a plurality of electron beams are generated by further including means for dividing an electron beam generated by the electron beam generating section 10 into a plurality of electron beams.

The first multi-axis electron lens 16 independently focuses each of the plurality of electron beams, which is shaped into rectangular shape, and independently adjusts focal point of each of the electron beams to the second shaping member 22. Here, the coil section provided in the apertures of the first multi-axis electron lens 16 forms a magnetic field in the apertures, and adjusts focal point, position of optical axis, and astigmatism of the passing electron beam. The first shaping deflector 18 independently deflects the plurality of electron beams, which are shaped into rectangular shapes by the first shaping member, so that the plurality of electron beams are irradiated on desired positions on the second shaping member 22.

The second shaping deflector 20 deflects the plurality of electron beams deflected by the first shaping deflector 18 in substantially perpendicular direction to the second shaping member 22, and irradiates them on the second shaping member 22. Then the second shaping member 22, which includes a plurality of apertures having rectangular shapes, further shapes the electron beams, which have rectangular cross-sectional shapes and are irradiated on the second shaping member 22, into the electron beams having desired cross-sectional shapes for irradiating them on the wafer 44.

The second multi-axis electron lens 24 independently focuses the plurality of electron beams, and independently adjusts the focal point of each of the electron beams to the blanking-electrode array 26. Here, the coil section provided in the apertures of the second multi-axis electron lens 24 forms a magnetic field in the apertures, and adjusts the focal point, the position of the optical axis, and the astigmatism of the passing electron beam. Then, the plurality of electron beams, of which the focal points are adjusted by the second multi-axis electron lens 24, respectively pass a plurality of apertures of the blanking-electrode array 26.

The blanking electrode array control section 86 controls whether or not the voltage is applied to the deflecting electrodes provided in the vicinity of each of the apertures of the blanking-electrode array 26. The blanking-electrode array 26 selects whether or not each of the electron beams are irradiated on the wafer 44 based on the voltage applied to each of the deflecting electrodes.

The electron beam which is not deflected by the blanking-electrode array 26 passes through the third multi-axis electron lens 34. Then the third multi-axis electron lens 34 reduces the diameter of the electron beam which passes through the third multi-axis electron lens 34. Here, the coil section provided in the aperture of the third multi-axis electron lens 34 forms a magnetic field in the aperture, and adjusts the focal point, the position of an optical axis, and the astigmatism of the passing electron beam. The reduced electron beam passes an aperture of the electron beam blocking member 28. Moreover, the electron beam blocking member 28 blocks the electron beam deflected by the blanking-electrode array 26. The electron beam which has passed the electron beam blocking member 28 enters the fourth multi-axis electron lens 36. Then, the fourth multi-axis electron lens 36 independently focuses each of the entered electron beams, and respectively adjusts the focal point of each of the electron beams to the deflecting section 38. Here, the coil section provided in the aperture of the fourth multi-axis electron lens 36 forms magnetic field in the aperture, and adjusts the focal point, the position of the optical axis, and the astigmatism of the passing electron beam. The electron beam, of which the focal point is adjusted by the fourth multi-axis electron lens 36, enters the deflecting section 38.

The deflection control section 92 controls a plurality of deflectors of the deflecting section 38, and independently deflects each of the electron beams, which enters the deflecting section 38, into the position where it is to be irradiated on the wafer 44.

The fifth multi-axis electron lens 52 adjusts the focal point of each of the electron beams to the wafer 44 which passes through the fifth multi-axis electron lens 52. Here, the coil section provided in an aperture of the fifth multi-axis electron lens 52 forms a magnetic field in the aperture, and adjusts the focal point, the position of an optical axis, and the astigmatism of the passing electron beam. Then, each of the electron beams, having the cross-sectional shape which is to be irradiated on the wafer 44, is irradiated on a desired position of the wafer 44, where it is to be irradiated.

During the exposure processing, it is preferable that the wafer stage drive section 48 continuously moves the wafer stage 46 to a predetermined direction based on a direction from the wafer stage control section 96. Then, according to the movement of the wafer 44, a desired circuit pattern is exposed on the wafer 44 by shaping the cross-sectional shape of each of the electron beams to the shapes which are to be irradiated on the wafer 44, by selecting the apertures, which allow the passage of the electron beams which are to be irradiated on the wafer 44, and by deflecting each of the electron beams so that it is irradiated on the desired position of the wafer 44.

Figure 3A:
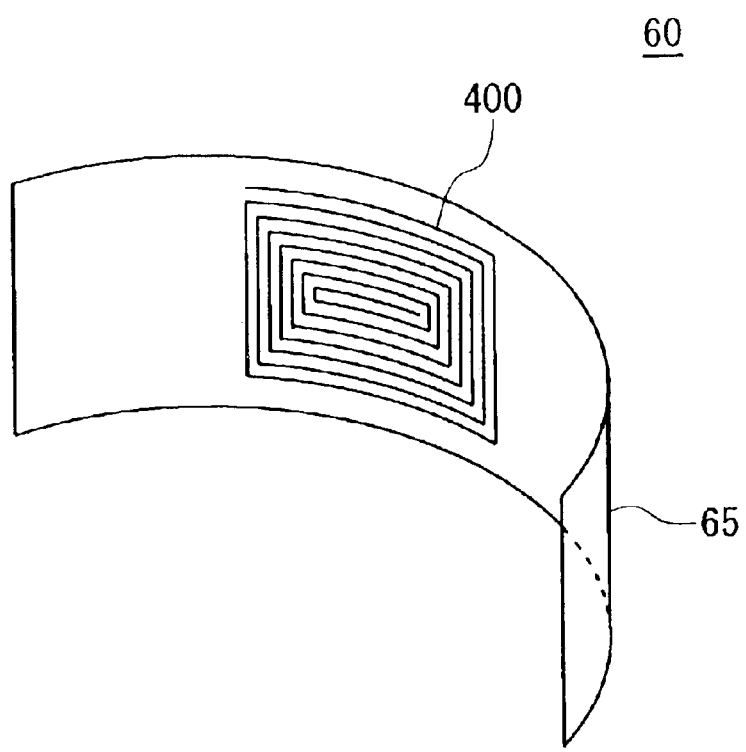
FIGS. 3A and 3B show coil sections according to the present embodiment.

FIG. 3 shows the coil section 60 according to the present embodiment. As shown in FIG. 3A, the coil section 60 includes an insulating member 65 and a coil 400. It is preferable that the coil section 60 is a rigid-framed saddle coil. It is also preferable that the insulating member 65 is an insulating sheet, formed of such as polyimide.

Figure 3B:
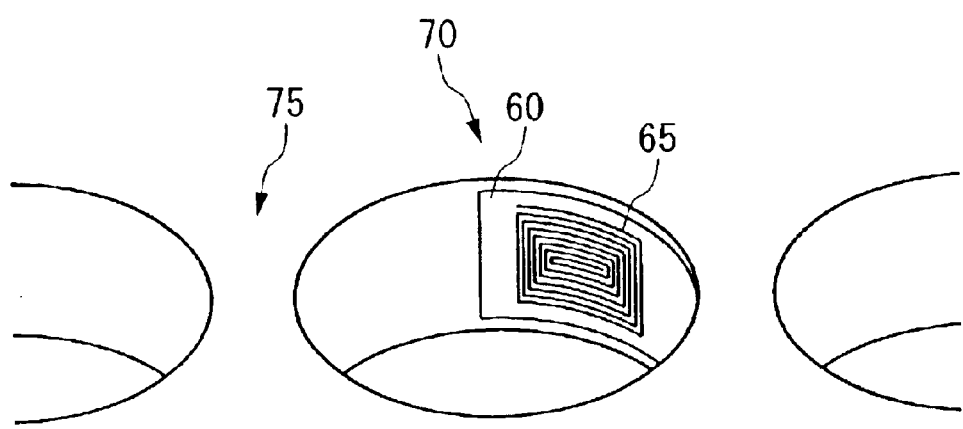

Moreover, as shown in FIG. 3B, the coil section 60 in the present embodiment is provided on the wall of the aperture 70 of the multi-axis electron lens. Then the insulating member 65 insulates the coil 400 and a magnetic conductor 75 of the multi-axis electron lens. The coil 60 is preferably provided so that the magnetic field is generated in the direction substantially perpendicular to the direction of the electron beam which passes through the aperture 70, by supplying current to the coil 60.

The first multi-axis electron lens 16, the second multi-axis electron lens 24, the third multi-axis electron lens 16, the fourth multi-axis electron lens, and the fifth multi-axis electron lens of the electron beam exposure system 100 have the same configuration as one another. Therefore, the configuration of the first multi-axis electron lens 16 will be explained hereinafter as a representative example of the multi-axis electron lens.

Figure 4A:
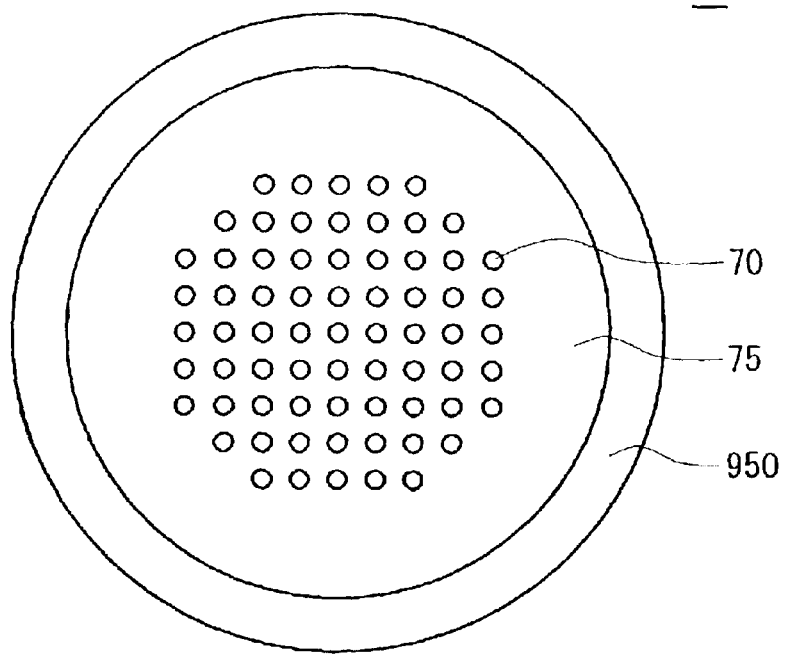
FIGS. 4A and 4B are top views of a first multi-axis electron lens according to the present embodiment.
Figure 4B:
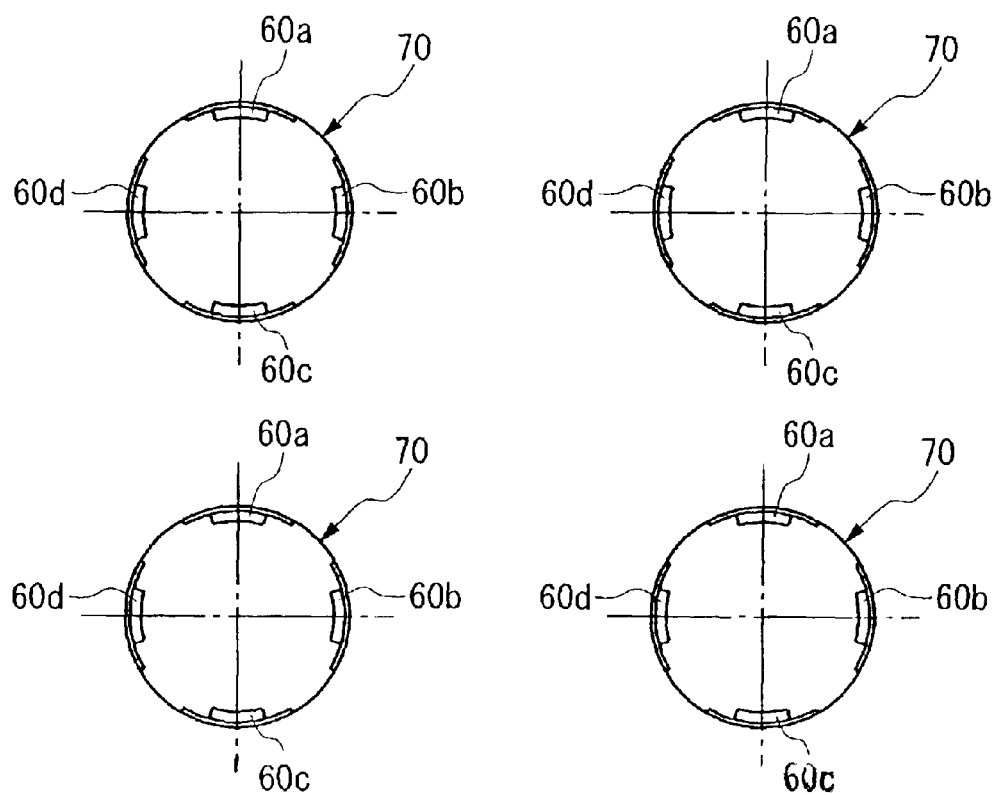

FIG. 4 shows the first multi-axis electron lens 16 according to the present embodiment. FIG. 4A is a general view of the first multi-axis electron lens 16. As shown in FIG. 4A, the first multi-axis electron lens 16 includes: the magnetic conductor 75 with a plurality of apertures 70, through which a plurality of electron beams pass; and a coil section 950, which is provided in the circumference of the magnetic conductor 75 and generates a magnetic field. Moreover, FIG. 4B shows enlargements of the vicinity of the apertures 70 shown in FIG. 4A. As shown in FIG. 4B, it is preferable that a coil section 60a is provided on the wall of each of the apertures 70 so that magnetic field is generated in the direction substantially perpendicular to the irradiation direction of the electron beam which passes through each of the apertures 70. It is also preferable that a coil section 60b is provided in each of the apertures 70 so that magnetic field is formed in the direction substantially perpendicular to the direction of the magnetic field formed by the coil section 60a. Furthermore, it is also preferable that coil sections 60c and 60d of coil sections are provided in the opposite side of the coil sections 60a and 60b respectively.

The electron beam exposure system 100 according to the present embodiment adjusts the focal point, the position of the optical axis, and the astigmatism of the electron beam which passes through each of the apertures 70 by adjusting the magnetic field formed in each of the apertures 70 of the electron lens using two coil sections 60a and 60b which form two orthogonalized magnetic fields.

Figure 5:
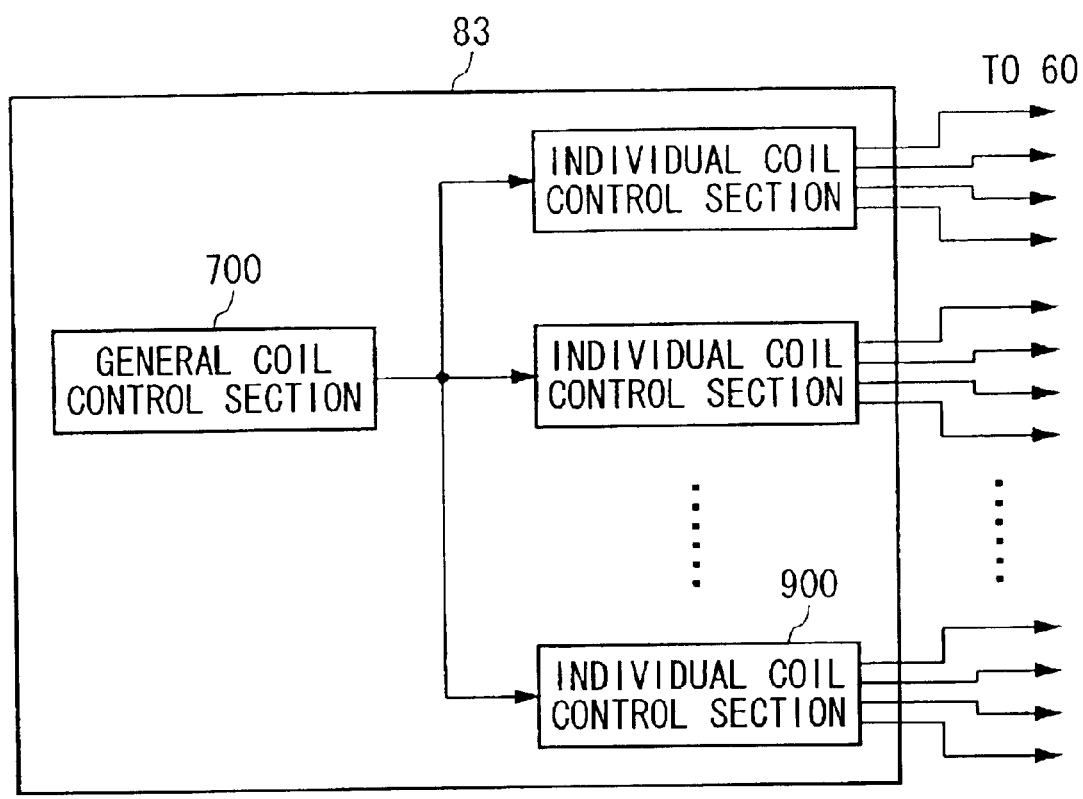
FIG. 5 is configuration of a coil control section according to the present embodiment.

FIG. 5 shows a configuration of the coil control section 83 according to the present embodiment. The coil control section 83 includes a general coil control section 700 for collectively controlling the plurality of coil sections 60 provided in the first multi-axis electron lens 16, and individual coil control sections 900 for independently controlling the current supplied to each of the plurality of coil sections 60 provided in each of the apertures 70 of the first multi-axis electron lens 16. The general coil control section 700 controls the individual coil control sections 900 to control the magnetic field formed in each of the apertures 70 by each of the coil sections 60 so that the magnetic field formed in each of the plurality of apertures 70 of the first multi-axis electron lens 16 is substantially equal to one another.

Alternatively, the general coil control section 700 determines the current supplied to each of the plurality of coil sections 60 based on the position of each of the plurality of apertures 70 in which each of the plurality of coil sections 60 is provided. For example, the general coil control section 700 determines the current supplied to each of the plurality of coil sections 60 based on a distance between the coil section 950 and each of the plurality of apertures 70. Alternatively, the general coil control section 700 determines the current supplied to each of the plurality of coil sections 60 based on a distance between the center of the magnetic conductor 75 and each of the plurality of apertures 70. Specifically, the general coil control section 700 determines the current supplied to each of the plurality of coil sections 60 so that current supplied to the coils in a part of the apertures 70 which are located outside a predetermined circumference of the first multi-axis electron lens 16, is lower than current supplied to the coils in another part of the apertures 70 which is located inside the predetermined circumference of the first multi-axis electron lens 16.

Then, the individual coil control sections 900 control the current supplied to the plurality of coil sections 60, which correspond to an individual coil section 803b, provided in each of the apertures 70 based on the directions of the general coil control section 700. Alternatively, each of the coil control sections 900 adjusts the astigmatism and/or the position of the optical axis of the electron beam by supplying different current to each of the plurality of coil sections 60 which is to be controlled by each of the individual coil control section 900 respectively. Alternatively, each of the individual coil control sections 900 adjusts the focal point of the electron beam by supplying substantially equal current to each of the plurality of coil sections 60 which is to be controlled by the individual coil control section 900 respectively.

Alternatively, the individual coil control sections 900 collectively control the current supplied to the coil sections 60 which are classified into predetermined groups. For example, when a substantially uniform magnetic field is formed at a part of the plurality of apertures 70 which are located from substantially same distance from the medial axis of the first multi-axis electron lens 16 as one another, and when substantially the same adjustment is to be required for each of the apertures 70 as one another, the coil control section 83 collectively controls the part of the plurality of the coil sections 60 in the plurality of apertures 70 which are located from substantially the same distance from the medial axis of the multi-axis electron lens 16 as one another, which are classified as a group.

Alternatively, the electron beam exposure system 100 further includes means for computing a correction value for adjusting such as an irradiation position or a shape of the electron beam based on such as the irradiation position and the shape of the electron beam, so that the coil control section 83 controls the coil section 60 based on the computed correction value.

Figure 6:
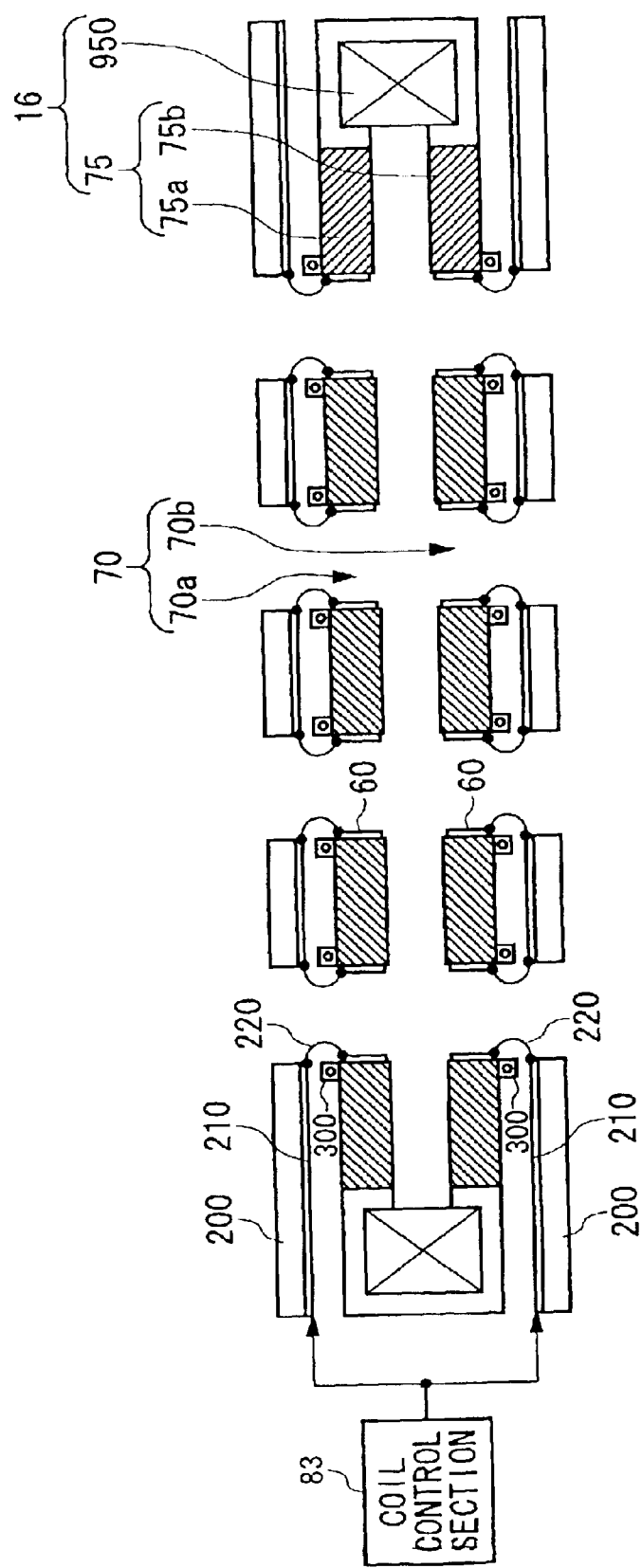
FIG. 6 is a cross section of the first multi-axis electron lens according to the present embodiment.

FIG. 6 is a cross section of the first multi-axis electron lens 16. The first multi-axis electron lens 16 includes: the magnetic conductor 75, where the magnetic conductor 75 includes a first magnetic conductor 75a with a plurality of apertures 70a through which the electron beams pass, and a second magnetic conductor 75b being arranged substantially parallel with the first magnetic conductor 75a and including a plurality of apertures 70b through which the electron beams pass; the coil section 950 which is in the circumference of the magnetic conductor 75 and forms a magnetic field; the coil section 60 provided in the apertures 70a of the first magnetic conductor 75a; and the coil section 60 provided in the apertures 70b of the second magnetic conductor 75b. Alternatively, the coil section 60 is provided in at least either of the first magnetic conductor 75a or the second magnetic conductor 75b.

Alternatively, the electron beam exposure system 100 further includes: a substrate 200 which is provided substantially parallel with the first multi-axis electron lens 16, and includes a wiring 210 in which the current to the coil section 60 flows; and a wire section 220 which connects the coil section 60 and the wiring 210. A plurality of wirings 210, in which the current to each of the plurality of coil sections 60 flows, are provided on the substrate 200. One end of each of the plurality of wirings 210 electrically connects with each of the plurality of coil sections 60 by the wire section 220. Moreover, the coil control section 83 supplies a predetermined current to each of the coil sections 60 by connecting the other end of each of the plurality of wirings 210 to the coil control section 83.

Alternatively, the substrates 200 are provided for both of the first magnetic conductor 75a and the second magnetic conductor 75b, and the plurality of coil sections 60 provided in the apertures 70a of the first magnetic conductor 75a and the apertures 70b of the second magnetic conductor 75b are connected to the wirings 210 provided on the substrates 200 provided for each of the first magnetic conductor 75a and the second magnetic conductor 75b, respectively.

Alternatively, the first multi-axis electron lens further includes a cooling section 300 for cooling the first magnetic conductor 75a and the second magnetic conductor 75b. The cooling section 300 controls temperature rise of the first magnetic conductor 75a and the second magnetic conductor 75b, which is caused by the current flowing in the coil section 60 provided in the aperture 70a of the first magnetic conductor 75a, and the coil section 60 provided in the apertures 70b of the second magnetic conductor 75b. For example, the cooling section 300 cools the first magnetic conductor 75a and the second magnetic conductor 75b by letting coolant to flow in a conduit provided on the surface of the first magnetic conductor 75a and the second magnetic conductor 75b.

The electron beam exposure system 100 according to the present embodiment adjusts the focal point, the position of the optical axis, and the astigmatism of the electron beam which passes through each of the apertures 70 by adjusting the magnetic field formed in the aperture 70 of the electron lens using two coil sections 60 which respectively form two orthogonalized magnetic fields. Therefore, according to the electron beam exposure system 100 of the present embodiment, a pattern is accurately exposed on a wafer.

As it is obvious from the foregoing explanation, according to the present invention, there are provided the electron beam exposure system and the electron lens for independently focusing the plurality of electron beams and accurately exposing a pattern.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. An electron beam exposure system for exposing a pattern on a wafer by a plurality of electron beams, comprising:

an electron beam generating section for generating the plurality of electron beams;

an electron lens section with a plurality of apertures through which the plurality of electron beams pass, for independently focusing the plurality of electron beams; and a first magnetic field formation section, which is provided in at least one of the plurality of apertures, for forming a magnetic field in a direction substantially perpendicular to an irradiation direction of the electron beams passing through one of said plurality of apertures.

2. The electron beam exposure system as claimed in claim 1, wherein said first magnetic field formation section is provided on a wall of one of said plurality of apertures.

3. The electron beam exposure system as claimed in claim 2, wherein said first magnetic field formation section comprises a coil for forming a magnetic field and an insulating member provided between said coil and the wall of the aperture.

4. The electron beam exposure system as claimed in claim 1, wherein said first magnetic field formation section comprises:

a plurality of first magnetic field formation sections, which are provided in the plurality of apertures; and a coil control section for independently controlling current supplied to each of said plurality of first magnetic field formation sections.

5. The electron beam exposure system as claimed in claim 4, wherein said coil control section independently controls current supplied to each of said plurality of first magnetic field formation sections based on position of each of said plurality of apertures in which each of said plurality of first magnetic field formation sections is provided.

6. The electron beam exposure system as claimed in claim 5, wherein said coil control section controls the current so that current supplied to a part of said plurality of magnetic field formation sections provided in first apertures of the plurality of apertures is higher than current supplied to another part of said plurality of magnetic field formation sections provided in second apertures of the plurality of apertures, where the second apertures are located outside of the first apertures in said electron lens section.

7. The electron beam exposure system as claimed in claim 1, further comprising a second magnetic field formation section provided in a position for forming magnetic field in a direction substantially perpendicular to the direction of the magnetic field formed in the aperture by said first magnetic field formation section.

8. The electron beam exposure system as claimed in claim 7, further comprising a coil control section for independently controlling the current supplied to said first magnetic field formation section and current supplied to said second magnetic field formation section.

9. The electron beam exposure system as claimed in claim 7, further comprising a third magnetic field formation section and a fourth magnetic field formation section, which are provided in an opposite side of the first magnetic field formation section and the second magnetic field formation section respectively.

10. The electron beam exposure system as claimed in claim 1, wherein said electron lens section comprises:

a first magnetic conductor with a plurality of apertures through which the plurality of electron beams pass;

a second magnetic conductor with a plurality of apertures through which the plurality of electron beams pass; wherein said second magnetic conductor is provided substantially parallel with said first magnetic conductor;

said first magnetic field formation section is provided in the apertures of said first magnetic conductor, and the electron beam exposure system further comprises a fifth magnetic field formation section provided in the apertures of said second magnetic conductor.

11. The electron beam exposure system as claimed in claim 10, further comprising a cooling section for cooling said first magnetic conductor and said second magnetic conductor.

12. The electron beam exposure system as claimed in claim 1, further comprising:

a substrate, which is provided substantially in parallel with said electron lens section, including wiring in which the current to said first magnetic field formation section flows; and a wire section for connecting said first magnetic field formation section and said wiring.

13. An electron lens for independently focusing a plurality of electron beams, comprising:

a first magnetic conductor with a plurality of apertures through which the plurality of electron beams pass;

a second magnetic conductor with a plurality of apertures through which the plurality of electron beams pass, wherein said second magnetic conductor is provided substantially parallel with said first magnetic conductor; and a magnetic field formation section, which is provided in at least one aperture of the plurality of first apertures and the plurality of second apertures, for forming a magnetic field in a direction substantially perpendicular to an irradiation direction of the electron beams passing through said apertures.

14. An electron beam exposure system for exposing a pattern on a wafer by a plurality of electron beams, comprising:

an electron beam exposure apparatus comprising:

an electron beam generating section provided at one end of said electron beam exposure apparatus;

a wafer stage provided at the other end of said electron beam exposure apparatus, and opposing to said electron beam generating section;

at least one shaping member provided between said electron beam generating section and said wafer stage, including a plurality of apertures having predetermined shapes, each of said apertures having an axis extending in a direction substantially parallel with an irradiation direction of the electron beams; and at least one electron lens section provided between said electron beam generating section and said wafer stage, and positioned either upstream or downstream of said shaping member in the irradiation direction of the electron beams, said electron beam generating section comprising:

a plurality of apertures with an axis extending in a direction substantially parallel with the irradiation direction of the electron beams; and at least one magnetic field formation section provided at each of said plurality of apertures for forming a magnetic field in a direction substantially perpendicular to the irradiation direction of the electron beams passing through each of said plurality of apertures.

15. An electron lens used for an electron beam exposure system for exposing a pattern on a wafer by a plurality of electron beams, comprising:

a plurality of apertures with an axis extending in a direction substantially parallel with an irradiation direction of the electron beams; and at least one magnetic field formation section provided at each of said plurality of apertures, for forming a magnetic field in a direction substantially perpendicular to the irradiation direction of the electron beams passing through each of said plurality of apertures.

16. An electron lens section disposed in an electron beam exposure apparatus, comprising:

a plurality of apertures with an axis extending in a direction substantially parallel with an irradiation direction of the electron beams; and at least one magnetic field formation section provided in at least one of the plurality of apertures for forming a magnetic field in a direction substantially perpendicular to the irradiation direction of the electron beams passing through one of said plurality of apertures.

* * * * *